United States Patent
Krishna et al.

(10) Patent No.: US 10,843,920 B2
(45) Date of Patent: Nov. 24, 2020

(54) SUSPENDED MICROELECTROMECHANICAL SYSTEM (MEMS) DEVICES

(71) Applicant: Analog Devices International Unlimited Company, Limerick (IE)

(72) Inventors: Kotlanka Rama Krishna, Belmont, MA (US); Michael John Flynn, Waterford (IE); Lynn Khine, Singapore (SG); Seamus Paul Whiston, Limerick (IE); Paul Lambkin, Carrigaline (IE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/296,603

(22) Filed: Mar. 8, 2019

(65) Prior Publication Data

US 2020/0283291 A1    Sep. 10, 2020

(51) Int. Cl.
*B81C 1/00* (2006.01)
*B81B 3/00* (2006.01)
*H03H 9/24* (2006.01)

(52) U.S. Cl.
CPC ........ *B81C 1/00182* (2013.01); *B81B 3/0097* (2013.01); *H03H 9/2405* (2013.01); *B81B 2201/0271* (2013.01); *B81B 2203/019* (2013.01); *B81B 2203/0315* (2013.01);
(Continued)

(58) Field of Classification Search
CPC . B81C 1/00182; B81C 1/0019; B81B 3/0097; H03H 9/2405
See application file for complete search history.

(56) References Cited

U.S. PATENT DOCUMENTS

| 3,916,348 A | 10/1975 | Toda et al. |
| 4,384,409 A | 5/1983 | Lao |
| 4,449,107 A | 5/1984 | Asai et al. |

(Continued)

FOREIGN PATENT DOCUMENTS

| DE | 10 2006 002 805 A1 | 11/2007 |
| JP | 59-064908 | 4/1984 |

(Continued)

OTHER PUBLICATIONS

International Search Report and Written Opinion dated Feb. 22, 2018 in connection with International Application No. PCT/IB2017/001552.

(Continued)

*Primary Examiner* — Ida M Soward
(74) *Attorney, Agent, or Firm* — Wolf, Greenfield & Sacks, P.C.

(57) ABSTRACT

A microelectromechanical system (MEMS) device is provided that includes a substrate having a dielectric cavity formed therein and a movable electromechanical device suspended in the dielectric cavity. The dielectric cavity includes a substantially planar bottom surface and at least one sidewall surface extending substantially perpendicularly from the bottom surface. The movable electromechanical device is suspended in the dielectric cavity such that the movable electromechanical device is spaced apart from the bottom surface and the at least one sidewall surface of the dielectric cavity. The bottom surface of the cavity and each of the at least one sidewall surface of the cavity meet at a rectilinear corner.

20 Claims, 13 Drawing Sheets

(52) U.S. Cl.
CPC ..... *B81B 2203/0392* (2013.01); *B81C 1/0019* (2013.01); *B81C 2201/014* (2013.01)

(56) References Cited

U.S. PATENT DOCUMENTS

| | | | |
|---|---|---|---|
| 4,454,440 A | 6/1984 | Cullen | |
| 4,516,049 A | 5/1985 | Mikoshiba et al. | |
| 4,647,881 A | 3/1987 | Mitsutsuka | |
| 5,129,262 A | 7/1992 | White et al. | |
| 5,597,759 A | 1/1997 | Yoshimori | |
| 5,786,235 A | 7/1998 | Eisele et al. | |
| 5,914,553 A | 6/1999 | Adams et al. | |
| 5,939,956 A | 8/1999 | Arimura et al. | |
| 6,124,765 A | 9/2000 | Chan et al. | |
| 6,150,748 A | 11/2000 | Fukiharu | |
| 6,420,816 B2 | 7/2002 | Getman et al. | |
| 6,465,355 B1 | 10/2002 | Horsley | |
| 6,516,665 B1 | 2/2003 | Varadan et al. | |
| 6,556,103 B2 | 4/2003 | Shibata et al. | |
| 6,544,787 B1 | 5/2003 | Tsukahara et al. | |
| 6,566,787 B2 | 5/2003 | Tsukahara et al. | |
| 6,739,190 B2 | 5/2004 | Hsu et al. | |
| 6,828,713 B2 | 12/2004 | Bradley et al. | |
| 6,848,295 B2 | 2/2005 | Auner et al. | |
| 6,909,221 B2 | 6/2005 | Ayazi et al. | |
| 6,943,484 B2 | 9/2005 | Clark et al. | |
| 6,954,020 B2 | 10/2005 | Ma et al. | |
| 6,987,432 B2 | 1/2006 | Lutz et al. | |
| 6,995,622 B2 | 2/2006 | Partridge et al. | |
| 7,005,946 B2 | 2/2006 | Duwel et al. | |
| 7,068,125 B2 | 6/2006 | Lutz et al. | |
| 7,083,997 B2 | 8/2006 | Brosnihhan et al. | |
| 7,102,467 B2 | 9/2006 | Lutz et al. | |
| 7,211,926 B2 | 5/2007 | Quevy et al. | |
| 7,215,061 B2 | 5/2007 | Kihara et al. | |
| 7,250,322 B2* | 7/2007 | Christenson | B81C 1/00047 257/E21.683 |
| 7,352,608 B2 | 4/2008 | Mohanty et al. | |
| 7,471,028 B2 | 12/2008 | Onozawa | |
| 7,492,241 B2 | 2/2009 | Piazza et al. | |
| 7,504,909 B2 | 3/2009 | Tada | |
| 7,535,152 B2 | 5/2009 | Ogami et al. | |
| 7,602,099 B2 | 10/2009 | Fujimoto et al. | |
| 7,724,103 B2 | 5/2010 | Feng et al. | |
| 7,728,483 B2 | 6/2010 | Tanaka | |
| 7,791,432 B2 | 9/2010 | Piazza et al. | |
| 8,035,277 B2 | 10/2011 | Barber et al. | |
| 8,058,769 B2 | 11/2011 | Chen et al. | |
| 8,298,847 B2 | 10/2012 | Kogut et al. | |
| 8,319,312 B2 | 11/2012 | Morris, III et al. | |
| 8,362,675 B2 | 1/2013 | Chen et al. | |
| 8,492,855 B2 | 7/2013 | Lammel et al. | |
| 8,629,599 B2 | 1/2014 | Chen et al. | |
| 8,937,425 B2 | 1/2015 | Chen et al. | |
| 9,425,151 B2* | 8/2016 | Golda | B81C 99/002 |
| 9,511,994 B2* | 12/2016 | Tsai | B81C 1/00182 |
| 9,828,244 B2* | 11/2017 | Golda | B81C 99/002 |
| 10,227,233 B2* | 3/2019 | Allegato | B81C 1/00269 |
| 10,273,141 B2* | 4/2019 | Chang | B81B 3/001 |
| 10,276,419 B1* | 4/2019 | Kim | B25J 15/0085 |
| 10,294,098 B2* | 5/2019 | Lin | B81C 1/00238 |
| 2002/0001871 A1* | 1/2002 | Cho | B81C 1/0019 438/98 |
| 2002/0075100 A1 | 6/2002 | Katohno | |
| 2003/0060051 A1 | 3/2003 | Kretschmann et al. | |
| 2003/0148620 A1 | 8/2003 | Chavan et al. | |
| 2004/0065940 A1 | 4/2004 | Ayazi et al. | |
| 2004/0195096 A1 | 10/2004 | Tsamis et al. | |
| 2005/0073078 A1 | 4/2005 | Lutz et al. | |
| 2005/0151600 A1 | 7/2005 | Takeuchi et al. | |
| 2006/0279175 A1 | 12/2006 | Aigner | |
| 2007/0052324 A1 | 3/2007 | Chen et al. | |
| 2007/0222336 A1 | 9/2007 | Grannen et al. | |
| 2007/0224720 A1 | 9/2007 | Lee et al. | |
| 2008/0010690 A1 | 1/2008 | Delapierre | |
| 2008/0048804 A1 | 2/2008 | Volatier et al. | |
| 2008/0143217 A1 | 6/2008 | Ho et al. | |
| 2008/0186109 A1 | 8/2008 | Ho et al. | |
| 2008/0204153 A1 | 8/2008 | Yoshida et al. | |
| 2008/0272852 A1 | 11/2008 | Six | |
| 2008/0284286 A1 | 11/2008 | Ogawa et al. | |
| 2008/0297281 A1 | 12/2008 | Ayazi et al. | |
| 2009/0108381 A1 | 4/2009 | Buchwalter et al. | |
| 2009/0108959 A1 | 4/2009 | Piazza et al. | |
| 2009/0144963 A1 | 6/2009 | Piazza et al. | |
| 2009/0243747 A1 | 10/2009 | Gaidarzhy et al. | |
| 2009/0294638 A1 | 12/2009 | Mohanty et al. | |
| 2010/0007443 A1 | 1/2010 | Mohanty et al. | |
| 2010/0026136 A1 | 2/2010 | Gaidarzhy et al. | |
| 2010/0038991 A1 | 2/2010 | Shih et al. | |
| 2010/0134207 A1 | 6/2010 | Mohanty et al. | |
| 2010/0155883 A1 | 6/2010 | Wenzler et al. | |
| 2010/0181868 A1 | 7/2010 | Gaidarzhy et al. | |
| 2010/0319185 A1 | 12/2010 | Ayazi et al. | |
| 2010/0327701 A1 | 12/2010 | Grannen et al. | |
| 2012/0049965 A1 | 3/2012 | Chen et al. | |
| 2012/0049980 A1 | 3/2012 | Chen et al. | |
| 2012/0068277 A1* | 3/2012 | Kautzsch | B81C 1/00182 257/418 |
| 2012/0074810 A1 | 3/2012 | Chen et al. | |
| 2013/0069177 A1* | 3/2013 | Wang | B81C 1/00182 257/415 |
| 2013/0096825 A1 | 4/2013 | Mohanty | |
| 2013/0122627 A1 | 5/2013 | Harame et al. | |
| 2014/0306580 A1 | 10/2014 | Thalmayr | |
| 2015/0091412 A1 | 4/2015 | Chen et al. | |
| 2015/0298965 A1 | 10/2015 | Tsai et al. | |
| 2017/0210617 A1* | 7/2017 | Sadaka | B81B 1/002 |
| 2018/0134543 A1 | 5/2018 | Kuang et al. | |
| 2018/0148318 A1 | 5/2018 | Flynn et al. | |
| 2019/0341419 A1* | 11/2019 | Kropelnicki | G01J 5/0225 |

FOREIGN PATENT DOCUMENTS

| | | |
|---|---|---|
| JP | 02-007525 | 2/1990 |
| JP | 10-209801 | 8/1998 |
| JP | 2005-142902 | 6/2005 |
| JP | 2006-042116 | 2/2006 |
| JP | 2006-190797 A | 7/2006 |
| JP | 2006-286711 A | 10/2006 |
| JP | 2006-339941 A | 12/2006 |
| JP | 2008-098974 | 4/2008 |
| JP | 2008-258884 | 10/2008 |
| WO | WO 98/01948 A1 | 1/1998 |
| WO | WO 02/17481 A2 | 2/2002 |
| WO | WO 2004/095696 A2 | 11/2004 |
| WO | WO 2006/000611 A1 | 1/2006 |
| WO | WO 2006/083482 A2 | 8/2006 |
| WO | WO 2007/072408 A2 | 6/2007 |
| WO | WO 2007/072409 A2 | 6/2007 |
| WO | WO 2007/143520 A2 | 12/2007 |
| WO | WO 2010/011288 A1 | 1/2010 |

OTHER PUBLICATIONS

Humad et al., High frequency micromechanical piezo-on-silicon block resonators. International Electron Devices Meeting 2003IEDM. Technical Digest, Washington, D.C. Dec. 8-10, 2003. Dec. 8, 2003;957-60. 4 pages.

Kuypers et al., Intrinsic temperature compensation of aluminum nitride Lamb wave resonators for multiple-frequency references. Frequency Control Symposium. 2008 IEEE International. 2008;240-9.

Lakin et al., Temperature compensated bulk acoustic thin film resonators. Proceedings of IEEE Ultrasonics Symposium. 2000;1:855-8.

Piazza et al., Low motional resistance ring-shaped contour-mode aluminum nitride piezoelectric micromechanical resonators for UHF applications. Micro Electro Mechanical Systems. 18th IEEE International Conference, Miami Beach, Florida, Jan. 30-Feb. 3, 2005. Jan. 30, 2005;20-3.

(56) References Cited

OTHER PUBLICATIONS

Spriggs et al., Mechanical Properties of Pure, Dense Aluminum Oxide as a Function of Temperature and Grain Size. J Amer Ceramic Soc. Jul. 1964; 47(7):323-7.
Tirole et al., Lamb Waves Pressure Sensor Using an a N/Si Structure. Proceedings of Ultrasonics Symposium, Oct. 31, 1993-Nov. 3, 1993, Baltimore, MD. 1993;1: 371-4.
Yu et al., Ultra Temperature-Stable Bulk-Acoustic-Wave Resonators with Si0 2 Compensation Layer. IEEE Trans Ultrason Ferroelectr Freq Contr. 2007; 54(10):2102-9.
Benecke et al., MEMS Applications of Porous Silicon, Institute for Micro sensors, -actuators and -systems (IMSAS), 2001, 12 pages, available at: https://pdfs.semanticscholar.org/d7be/0d86c72b3372ca5ec16fc8bdac30ab0a5855.pdf.
Yasaitis et al., A modular process for integrating thick polysilicon MEMS devices with sub-micron CMOS, Proceedings of SPIE, Jan. 2003, vol. 4979, pp. 145-154.

\* cited by examiner

SUSPENDED MICROELECTROMECHANICAL SYSTEM (MEMS) DEVICES

FIELD OF THE DISCLOSURE

The present application relates to suspended microelectromechanical system (MEMS) devices and methods for fabricating such devices.

BACKGROUND

A MEMS device can be produced to have a structure that is suspended over a cavity. For example, a MEMS resonator can be produced to include a stack of patterned layers of materials suspended by tethers above a cavity in a substrate. The stack may include electrode layers, dielectric layers, a layer of a piezoelectric material, and other layers that are patterned and that may be required for an operational resonator. A MEMS resonator may be incorporated in a variety of devices, such as oscillators, mass sensors, gyros, accelerometers, and switches, for example, and may be used in a variety of applications that require accuracy and predictability, such as frequency and timing applications, signal filtering applications, and motion sensing applications, for example.

SUMMARY OF THE DISCLOSURE

A MEMS device is provided that includes a substrate having a dielectric cavity formed therein and a movable electromechanical device suspended in the dielectric cavity. The dielectric cavity includes a substantially planar bottom surface and at least one sidewall surface extending substantially perpendicularly from the bottom surface. The movable electromechanical device is suspended in the dielectric cavity such that the movable electromechanical device is spaced apart from the bottom surface and the at least one sidewall surface of the dielectric cavity. The bottom surface of the cavity and each of the at least one sidewall surface of the cavity meet at a rectilinear corner.

Aspects of the present application provide MEMS resonator structures that facilitate stable operation at a known and desired frequency. In this regard, temperature stability and mechanical stability are factors that may be taken into consideration for MEMS resonators and techniques for fabricating MEMS resonators. Aspects of the present application provided suspended MEMS resonators which are suspended in a substrate above a cavity of precisely controlled dimensions.

Suspended MEMS devices are described, in which the MEMS devices may each include a stack of patterned layers of materials suspended over a cavity. Each suspended MEMS device may be produced by forming the stack, which may include one or more electrode layers and an active layer, over a multilayer substrate. Part of the multilayer substrate then is removed from underneath the stack to form the cavity. Each suspended MEMS device may include at least one trench that extends vertically from an upper surface of the stack to the cavity. Each trench may include at least one trench sidewall and at least one stack sidewall. Each of the sidewalls may be formed of a dielectric material (e.g., an oxide) that serves as a dielectric spacer. The cavity may have rectilinear corners, and also may have substantially planar surfaces that give rise to linear cross-sectional profiles. The cavity may have at least one portion that extends laterally below and beyond the at least one trench sidewall to form at least one undercut region. The manner of fabrication of the suspended MEMS devices may allow for forming the cavities to have a high degree of reproducibility in size and shape, and thus may allow, for example, a MEMS resonator that vibrates stably at a known and desired frequency to be formed reproducibly.

According to an aspect of the present technology, a MEMS device is provided that may include a substrate having a dielectric cavity formed therein, and a movable electromechanical device suspended in the dielectric cavity. The cavity may include a substantially planar bottom surface and at least one sidewall surface extending substantially perpendicularly from the bottom surface. The electromechanical device may be spaced apart from the bottom and sidewall surfaces of the cavity. The bottom and each sidewall surface of the cavity may meet at a rectilinear corner. The dielectric cavity may completely surround bottom and side surfaces of the electromechanical device. The bottom and sidewall surfaces of the cavity may be formed of silicon oxide. The electromechanical device may be a resonator.

According to another aspect of the present technology, a MEMS device is provided that may include a substrate having a cavity formed therein, and a movable electromechanical device suspended in the cavity. The cavity may include a bottom surface, at least one sidewall surface extending substantially perpendicularly from the bottom surface, and an open top. A dielectric material may cover the bottom surface and each sidewall surface of the cavity. The movable electromechanical device, which is suspended above the bottom surface through the open top, may include bottom and side portions facing the dielectric material of the bottom and sidewall surfaces, respectively. The bottom surface of the cavity may have a substantially linear cross-sectional profile, and each sidewall surface of the cavity may have a substantially linear cross-sectional profile, such that the bottom surface and each sidewall surface meet at a rectilinear corner. The dielectric material may be silicon oxide, and the electromechanical device may be a resonator.

According to another aspect of the present technology, a method of forming a MEMS device is provided. According to the method, a substrate is provided that includes: a base layer, a sacrificial layer, a first dielectric layer positioned on a first side of the sacrificial layer and sandwiched between the base layer and the sacrificial layer, a second dielectric layer positioned on a second side of the sacrificial layer, an etchstop formed of a dielectric material and having a substantially vertical wall that extends between the first dielectric layer and the second dielectric layer, and an active layer covering a surface of the second dielectric layer. A movable electromechanical device is formed using the active layer and is isolated with an confinement trench that extends from a surface of the electromechanical device to an interface between the second dielectric layer and the sacrificial layer. The confinement trench may have vertical sidewalls formed of a dielectric material. A portion of the sacrificial layer between the electromechanical device and the first dielectric layer may be removed to form a dielectric cavity surrounding the electromechanical device. The cavity may include a bottom and a sidewall, with the bottom of the cavity corresponding to a portion of the first dielectric layer, and with the sidewall of the cavity corresponding to the etchstop. The bottom of the cavity may have a substantially linear cross-sectional profile, and the sidewall of the cavity may have a substantially linear cross-sectional profile, such that the bottom of the cavity and the sidewall of the cavity may form a rectilinear corner. The sacrificial layer may be formed of silicon, and the bottom of the cavity and the sidewall of the cavity may be formed of silicon oxide.

According to an aspect of the present technology, a dielectric cavity in a semiconductor material is provided. The cavity may have rectilinear corners, and walls of the cavity may be substantially planar and may be formed of a dielectric material. The cavity may be structured to accommodate a movable device therein. For example, the movable device may be an electromechanical device that is suspended in the cavity, such that the electromechanical device does not contact a bottom surface of the cavity, and such that side and bottom surfaces of the electromechanical device are surrounded by the dielectric material of the cavity. The cavity may be formed by an etching process after the electromechanical device is fabricated, in which the dielectric material forming the walls of the cavity serve as etch stops in the etching process. The cavity may be a silicon oxide cavity, and the microelectromechanical device may be a MEMS resonator that is suspended in the cavity by at least one tether.

According to another aspect of the present technology, a suspended MEMS device is provided. The MEMS device may include a stack of layers including a bottom dielectric layer having a bottom surface positioned above a cavity in a multilayer substrate; a bottom electrode layer positioned above the bottom dielectric layer; an upper electrode layer positioned above the bottom electrode layer; an active layer positioned between the bottom electrode layer and the top electrode layer. The MEMS device also may include at least one trench surrounding the stack and extending substantially vertically from an upper surface of the stack to a cavity below the stack. Each trench may include at least one trench sidewall formed of a dielectric material. Each trench sidewall faces a stack sidewall, which also may be formed of a dielectric material. Surfaces of the cavity may be formed of a dielectric material. The cavity may have rectilinear corners and a planar bottom surface. Surfaces of the cavity may have linear (i.e., substantially straight or non-curved) profiles when viewed in cross section. Portions of the cavity may extend laterally below and beyond the at least one trench sidewall to form at least one undercut region.

According to another aspect of the present technology, a method for forming a suspended MEMS device is provided. The method includes providing a multilayer substrate that includes: a base or handle silicon layer, a substrate silicon layer disposed above the handle silicon layer, a first oxide layer sandwiched between the handle silicon layer and the substrate silicon layer, a second oxide layer positioned above the substrate silicon layer, a least one dielectric etchstop each having a wall that extends substantially vertically between the first oxide layer and the second oxide layer, and a polycrystalline silicon (polysilicon) layer positioned above the second oxide layer. The method also includes forming an electronic device that uses the polysilicon layer, which may include one or more sublayers of polysilicon, as a device or active layer. The method further includes confining the electronic device with a trench that extends from a surface of the electronic device to an interface between the second oxide layer and the substrate silicon layer. The trench has at least one substantially vertical trench wall formed of a dielectric material. The method also includes forming a cavity in the multilayer substrate by removing at least a portion of the substrate silicon layer underneath the electronic device, between the electronic device and the first oxide layer. Once formed, the cavity completely surrounds side and bottom surfaces of the electronic device. The surfaces of the cavity facing the electronic device are formed of at least one dielectric material, such that the side and bottom surfaces of the electronic device are completely surrounded by the at least one dielectric material. The cavity includes a bottom corresponding to a portion of the first oxide layer, at least one first sidewall corresponding to the at least one etchstop, and at least one second sidewall corresponding to the at least one trench wall. The bottom surface and the first and second sidewalls of the cavity have substantially linear profiles such that, when viewed in cross section, the cavity has rectilinear corners. Dimensions of the cavity are determined by thicknesses of layers of the MEMS device and the multilayer substrate and by dimensions of masks used in lithographic processes for forming the MEMS device. The cavity's dimensions are not sensitive to an amount of time used to etch or remove material to form the cavity.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference numeral in all the figures in which they appear.

DETAILED DESCRIPTION

Figure 1:
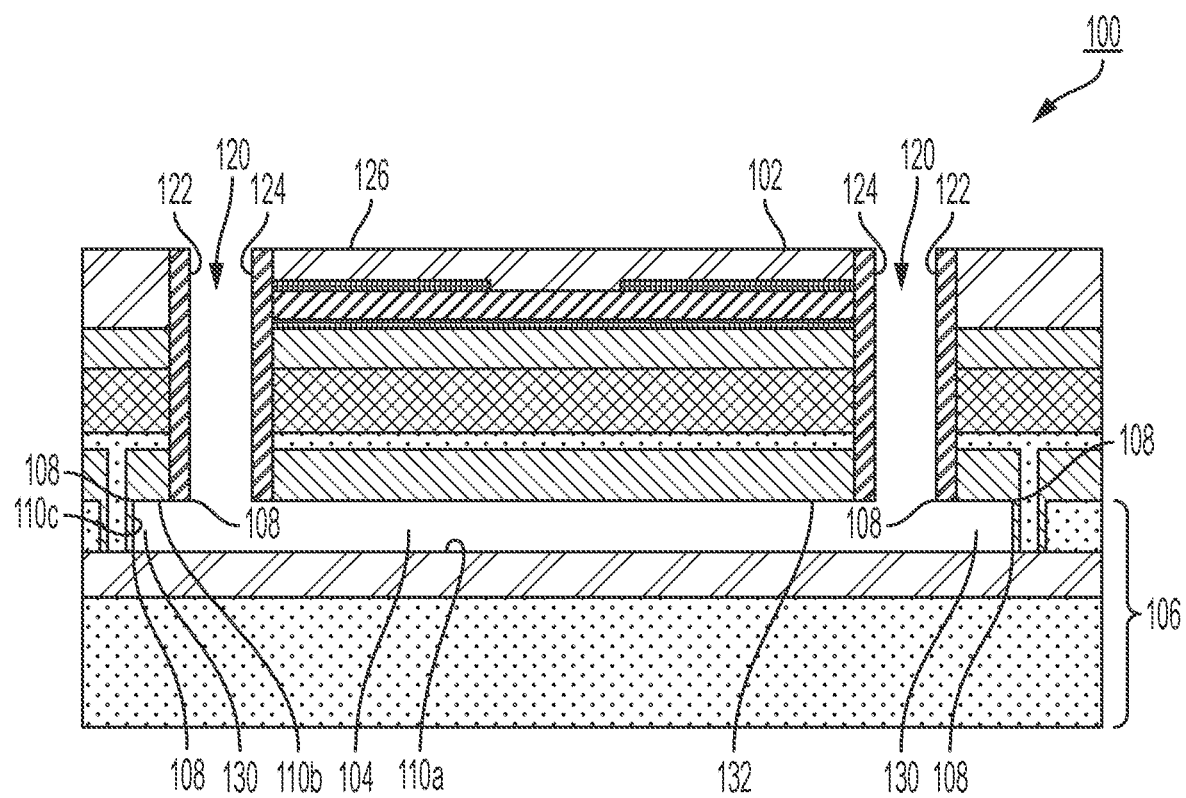
FIG. 1 schematically depicts a cross section of a MEMS device according to an embodiment of the present technology.

Aspects of the present application relate to suspended MEMS structures, such as MEMS resonators, and to fabrication techniques for making such structures. In some embodiments, features of a resonator are defined or formed prior to forming a cavity underneath the resonator, such that the resonator is suspended over the cavity. By forming the features of the resonator before the cavity is formed, it is possible for the features to be formed on surfaces that are more planar or flat than they would be if formed while a cavity is present. That is, if a cavity already is present then a layer formed above the cavity would be supported by one or more layers floating above the cavity. These one or more floating layers may not be flat and rigid but instead may be prone to having undulations or non-planar surface topology caused by, for example, stresses on the one or more floating layers. Such stresses can arise from thermal expansion mismatches of the layers, as well as from flexure of the one or more floating layers while the resonator is being formed. Such stresses may lead to resonators that cannot be fabricated consistently to have reproducible characteristics, and may even lead to defects in the resonator, which could have a negative impact on the resonator's fabrication yield.

The cavity surrounding the resonator has dimensions that are determined by thicknesses of layers of the multilayer substrate and layers of the resonator, positions of etchstops, and process tolerances of lithographic processes used to define a trench surrounding the resonator. Therefore, because the layer thicknesses can be very accurately controlled to be within a few tens of angstroms (Å), sometimes within 5 Å or less, and because the process tolerances can be very accurately controlled to produce patterns having widths within 10 Å, sometimes within 5 Å or less, it is possible to control the cavity's dimensions with a high degree of reproducibility and accuracy. The cavity's dimensions are not determined strictly by an amount of time used to remove or etch cavity material; therefore, dimensional variations caused by etch-rate variations (from one production lot to another production lot) are eliminated. The cavity is formed by selectively etching cavity material (e.g., silicon) and not appreciably etching material that is not cavity material (e.g., silicon oxide), thus making it possible to control with a high degree of accuracy an environment in which the resonator vibrates. This high degree of control over the cavity underlying the resonator enables the resonator to have stable and predictable operating characteristics.

Although the methods discussed below may refer to fabricating a MEMS resonator suspended over a cavity, the methods are applicable to fabricating other suspended devices.

A suspended MEMS device fabricated using the techniques described herein may have one or more physical features resulting from the fabrication process. One such feature is the presence of a spacer formed of a dielectric material (e.g., oxide) on each side of a trench that confines the device and that extends from an upper surface of the device to an underlying cavity.

To form the underlying cavity, cavity material is removed from underneath a stack of layers forming the device. The cavity material may be removed in an etching process that removes a portion of the multilayer substrate horizontally as well as vertically (e.g., an isotropic etch process). By using a boundary material having a significantly lower etch rate than that of the cavity material to define the cavity's boundaries, the boundary material may serve as a physical etch stop that limits further etching and enables the cavity to have corners that are rectilinear, a bottom surface that is substantially planar, and walls that have a linear (i.e., substantially straight) profile when viewed in cross section. Such a cavity is not possible when an isotropic etch process predominantly based on etch time is used.

FIG. 1 schematically depicts a cross section of a MEMS device 100 according to an embodiment of the present technology. The MEMS device 100 may include a resonator 102 suspended over a cavity 104 in a substrate 106. The resonator 102 may be confined by at least one trench 120 having a trench sidewall 122 and a device sidewall 124. Each device sidewall 124 may be located on a side surface of the resonator 102, and each trench sidewall 122 may face a corresponding one of the at least one device sidewall 124.

Each trench 120 may extend from a top surface 126 of the resonator 102 to a bottom surface 132 of the resonator 102. Each of the sidewalls 122, 124 may be oriented substantially vertically relative to the top and bottom surfaces 126, 132 of the resonator 102. A portion of the cavity 104 may extend laterally beneath and beyond each trench sidewall 122 to form at least one undercut region 130.

The cavity 104 may have rectilinear corners 108. Surfaces 110a, 110b, 110c, 122 of the cavity 104 may be formed of a dielectric material (e.g., silicon oxide) and may have linear (i.e., substantially straight) profiles when viewed in cross section. The dielectric material need not be the same for all of the surfaces 110a, 110b, 110c, 122 of the cavity 104.

The bottom surface 132 of the resonator 102 may be devoid of any relief structure, as in the embodiment shown in FIG. 1. That is, the bottom surface 132 may be substantially flat in this embodiment.

Figure 2:
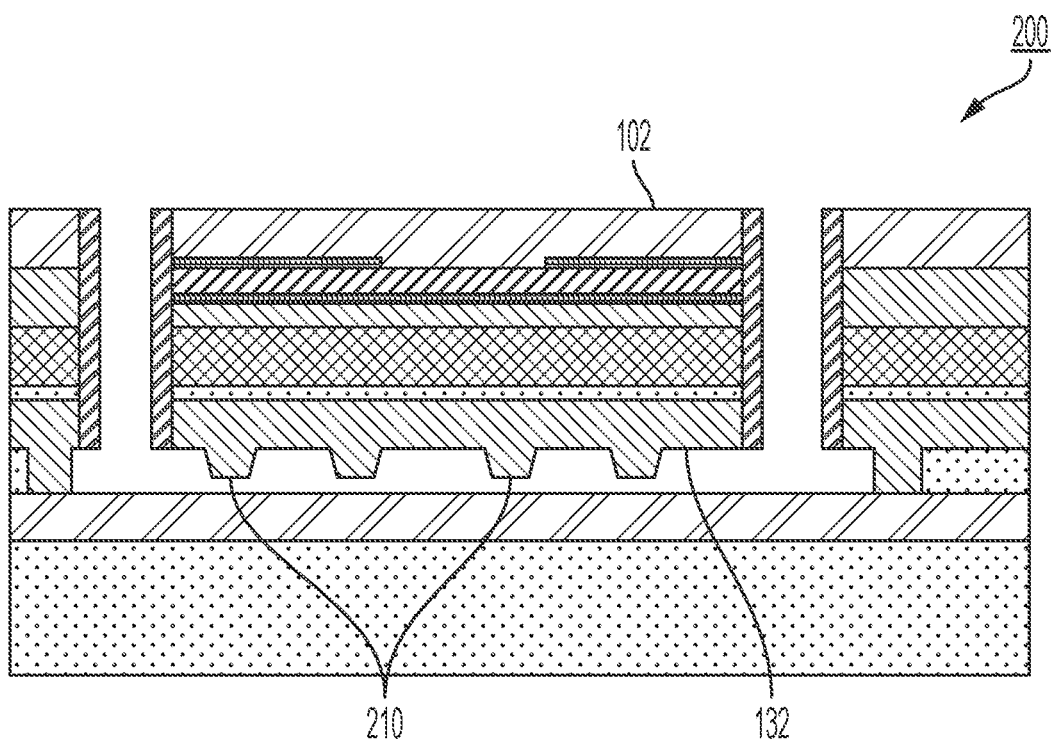
FIG. 2 schematically depicts a cross section of a MEMS device according to another embodiment of the present technology.

FIG. 2 schematically depicts a cross section of a MEMS device 200 according to another embodiment of the present technology. The resonator 102 of the MEMS device 200 may include projections 210 that extend from the bottom surface 132. The projections 210 may be formed of a dielectric material (e.g., silicon oxide) and may provide mechanical and thermal compensation for the resonator 102 to counteract temperature fluctuations and vibrational fluctuations in an environment of the resonator 102 and thus may enable the resonator 102 to operate stably in the presence of such fluctuations.

Figure 3:
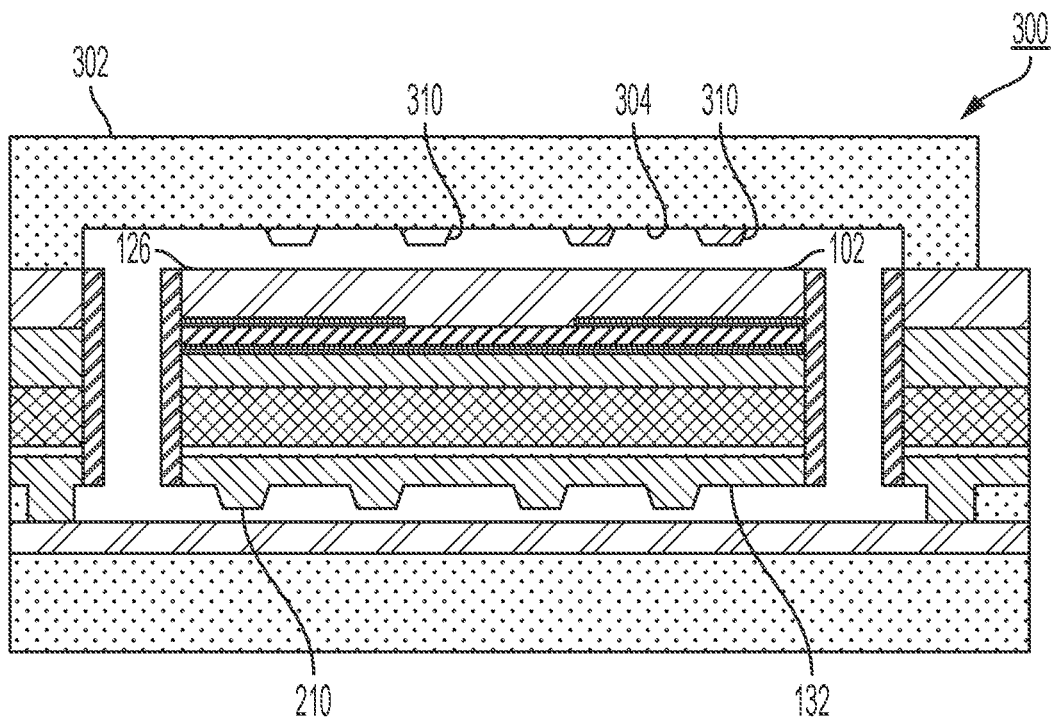
FIG. 3 schematically depicts a cross section of a MEMS device according to yet another embodiment of the present technology.

FIG. 3 schematically depicts a cross section of a MEMS device 300 according to yet another embodiment of the present technology. The MEMS device 300 varies from the MEMS device 200 by the presence of a cap structure 302 enclosing a region above the top surface 126 of the resonator 102. A bottom surface 304 the cap structure 302 faces the top surface 126 of the resonator 102 and may include cap projections 310 that extend toward the upper surface 126 of the resonator 102. The cap structure 302 may serve to protect the resonator 102 from environmental conditions. For example, the cap structure 302 may provide temperature compensation for the resonator 102. The cap projections 310 are formed of a dielectric material and may provide shock absorption for the resonator 102. For example, the cap projections may serve as stoppers to prevent excessive displace of the resonator 102, should the resonator 102 be subjected to shocks and/or vibrations. Optionally, the resonator 102 may include projections 210 that extend from the bottom surface 132 of the resonator 102.

In an embodiment of the present technology, a process flow for fabricating a MEMS device of the type shown in FIG. 1 is illustrated in FIGS. 4A-4I' and FIGS. 5A-5D.

Figure 4A:
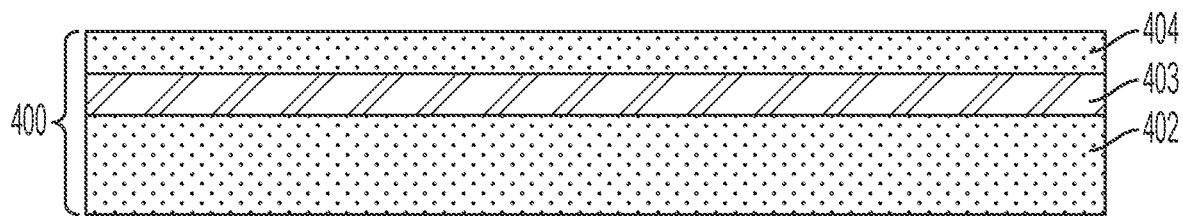
FIGS. 4A-4I' schematically show a process flow for fabricating MEMS devices according to embodiments of the present technology.

FIG. 4A shows an initial substrate 400, which may have a multilayer structure that includes a base or handle layer 402, a first active layer 404, and a first dielectric layer 403 sandwiched between the base layer 402 and the first active layer 404. The base layer 402 and the first active layer 404 may be formed of the same material or different materials. The base layer 402 and the first active layer 404 may be doped to the same dopant level or different dopant levels. For example, the initial substrate 400 may be a silicon-on-insulator (SOI) substrate in which the base layer 402 is formed of bulk silicon, the first dielectric layer 403 is formed of silicon oxide, and the first active layer 404 is formed of device-quality silicon.

Figure 4B:
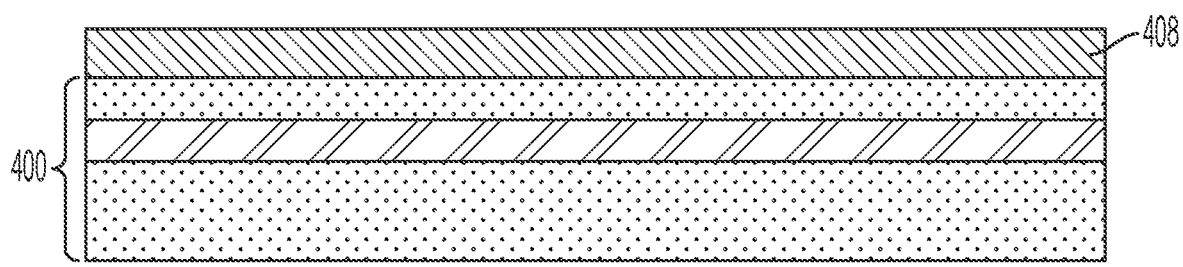

FIG. 4B shows a first field oxide layer 408 deposited or thermally grown on the first active layer 404 of the initial substrate 400. For example, the first field oxide layer 408 may be a silicon oxide layer thermally grown from the device-quality silicon forming the first active layer 404.

Figure 4C:
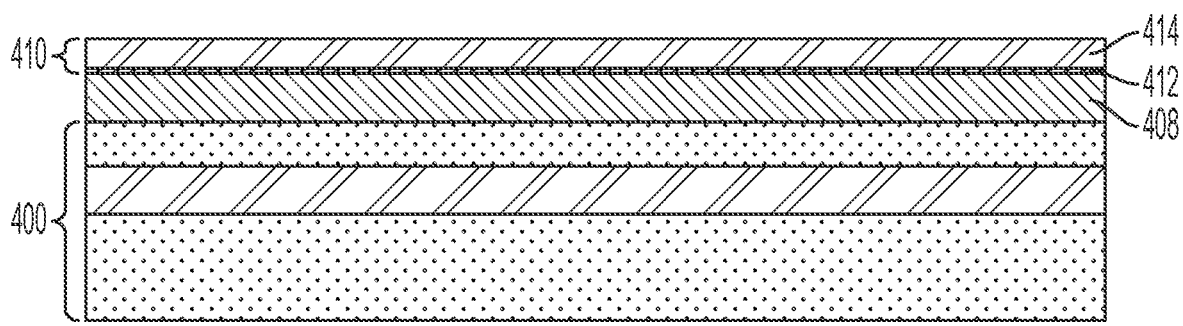

The first field oxide layer 408 may be patterned using standard lithographic techniques known in the art of device fabrication. FIG. 4C shows a mask layer 410 formed on the first field oxide layer 408. The mask layer 410, which is used to form a pattern in the first field oxide layer 408, may include a first hard-mask layer 412 and a second hard-mask layer 414 overlaying the first hard-mask layer 412. As used in the art, the term "hard" when used in reference to a fabrication mask indicates that the fabrication mask is not made from a photoresist material. For example, the first hard-mask layer 412 may be formed of a first non-photoresist material (e.g., a nitride), and the second hard-mask layer 414 may be formed of a second non-photoresist material (e.g., an oxide).

Standard photoresist-based lithographic techniques known in the art may be used to form a pattern in the mask layer 410. The pattern in the mask layer 410 then may be transferred to the first field oxide layer 408.

Figure 4D:
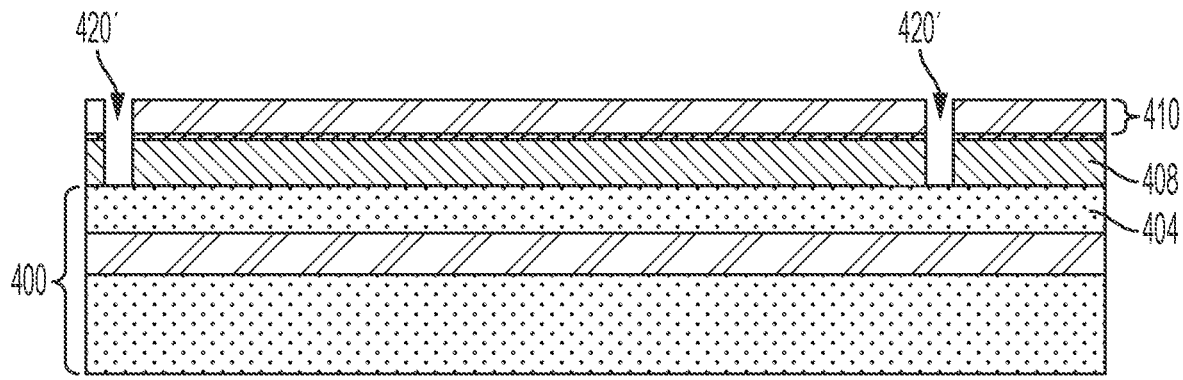

More specifically, the mask layer 410 may be patterned using photoresist to form holes in the mask layer 410 (i.e., a patterned mask layer). After the photoresist is removed, the patterned masked layer 410 is used to etch the first field oxide layer 408 to form at least one preliminary channel 420' in the first field oxide layer 408, such as shown in FIG. 4D. Each preliminary channel 420' extends through the first field oxide layer 408 to the first active layer 404.

Figure 4E:
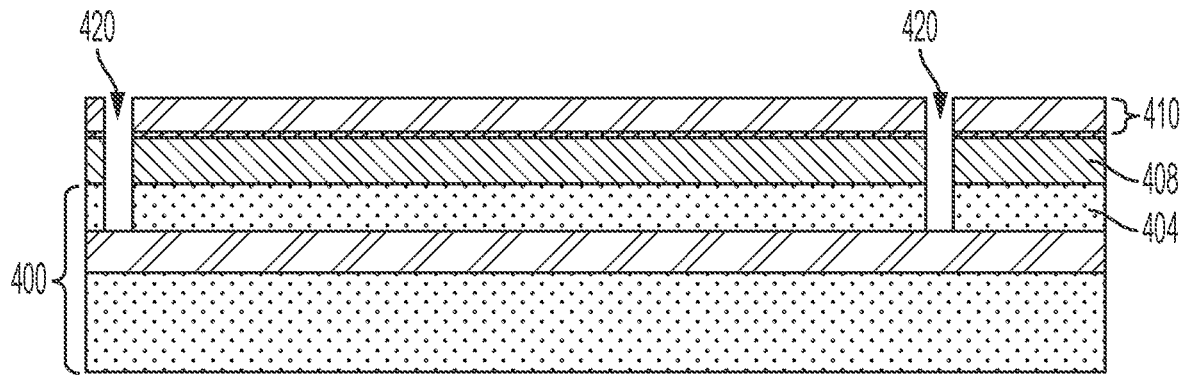

Each portion of the first active layer 404 exposed via the at least one preliminary channel 420' may be etched to form at least one channel 420 extending through the first active layer 404 to the first dielectric layer 403, as shown in FIG. 4E.

Figure 4F:
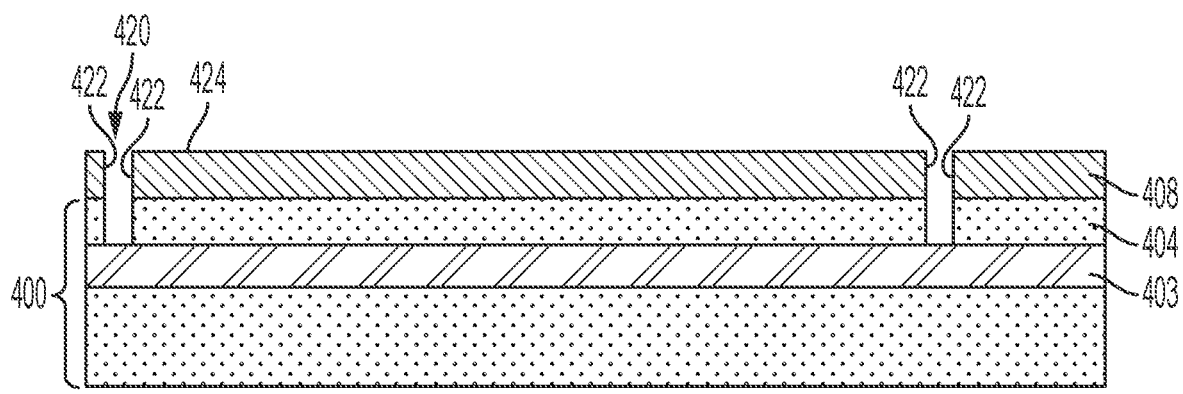

After removal of the mask layer 410, a structure such as shown in FIG. 4F may result. Each channel 420 has walls 422 that may extend substantially vertically from the first dielectric layer 403 to an exposed surface 424 of the first field oxide layer 408.

Figure 4G:
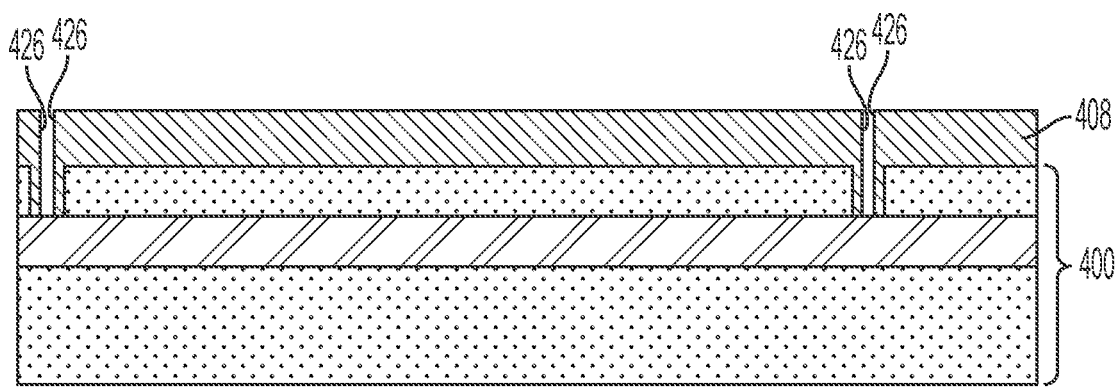
Figure 4G:
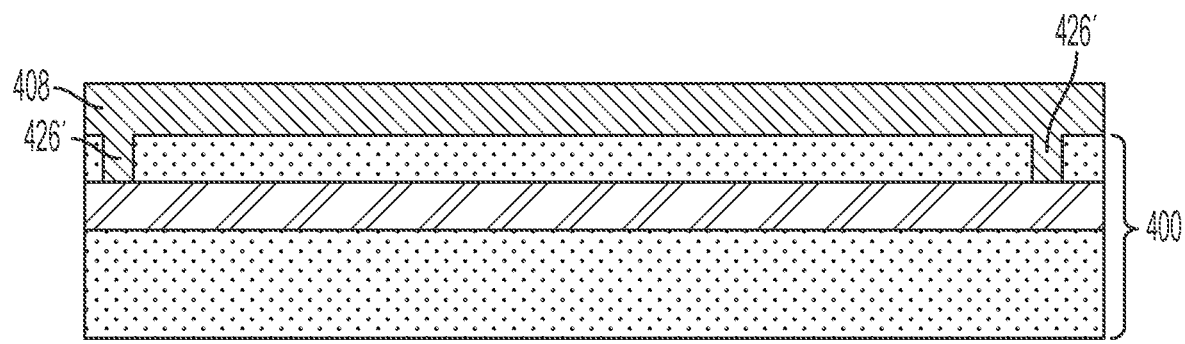
Figure 4H:
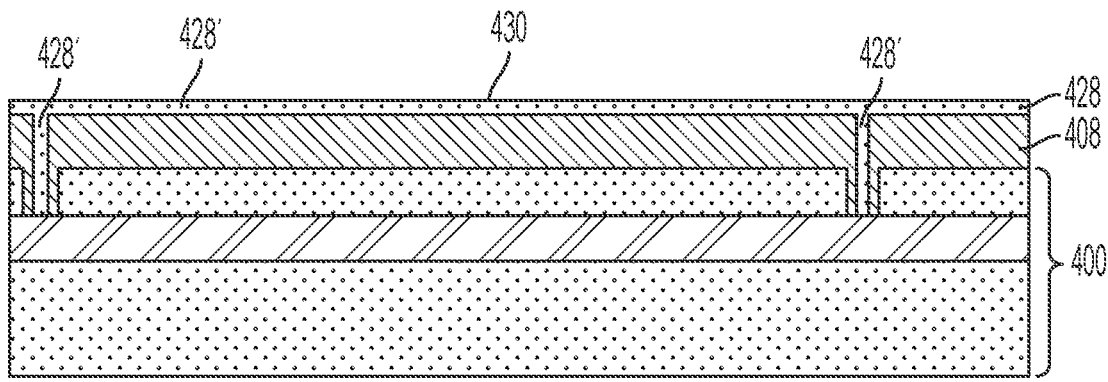
Figure 4H:
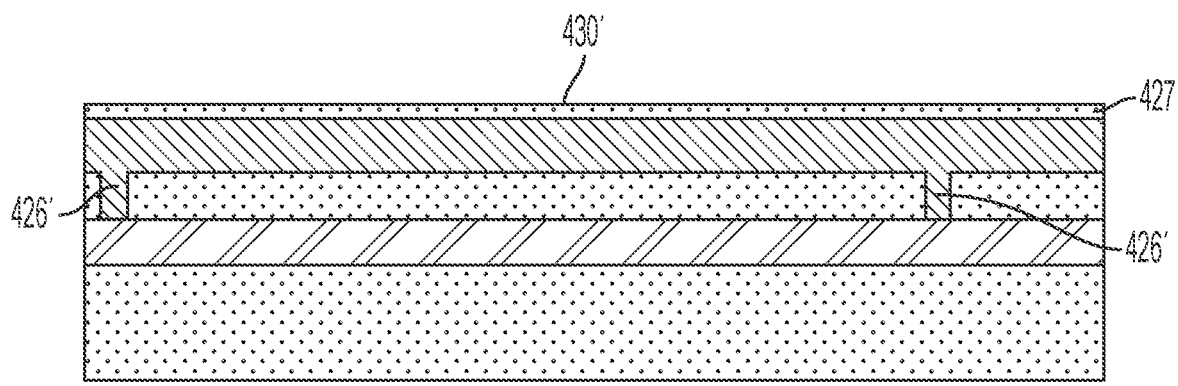
Figure 4I:
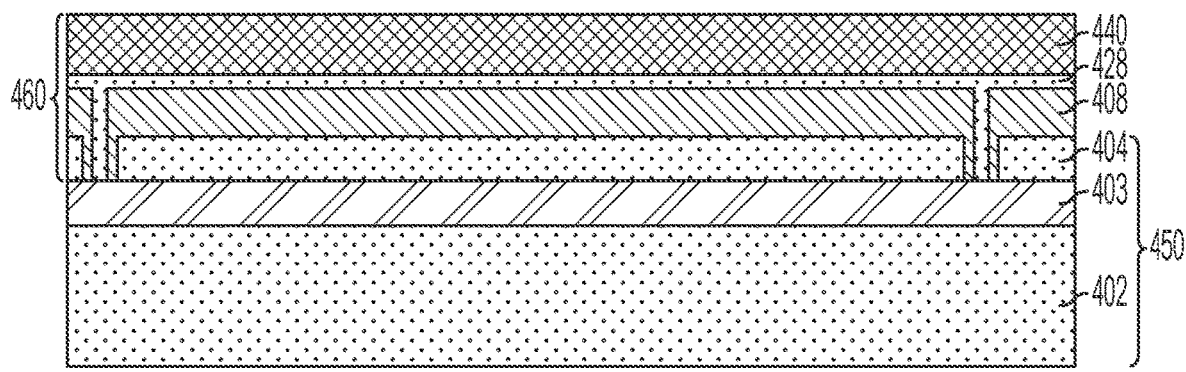
Figure 4I:
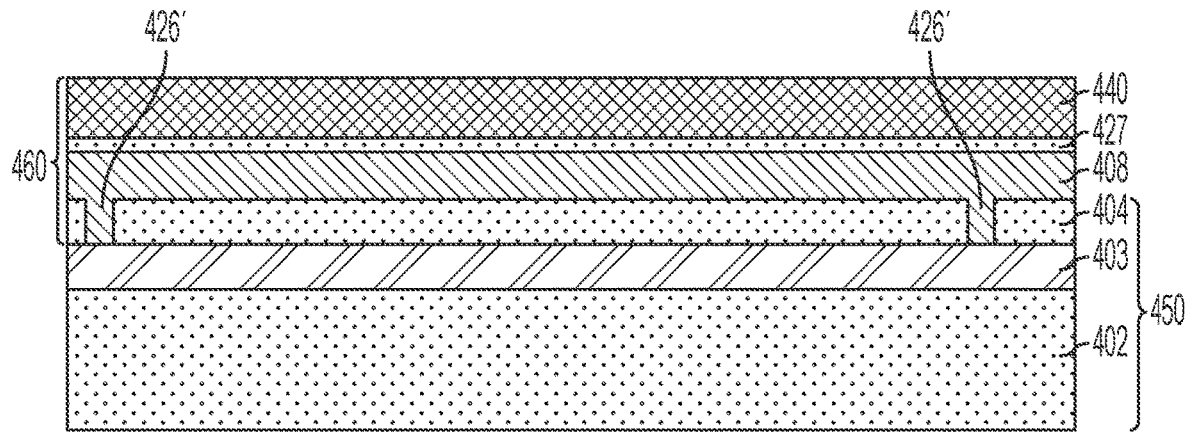

In one branch of the embodiment, the process flow may extend from FIG. 4F to FIGS. 4G-4I. In another branch of the embodiment, the process flow may extend from FIG. 4F to FIGS. 4G'-4I".

Portions of the first active layer 404 exposed after forming the at least one channel 420 may be covered by a dielectric material, such that dielectric liner layers 426 cover the walls 422 of each channel 420, as shown in FIG. 4G. For example, the dielectric material forming the liner layers 426 may be silicon oxide deposited on the walls 422 of each channel 420. A thickness of the first field oxide layer 408 may be augmented with the addition of silicon oxide deposited while the liner layers 426 are being deposited.

A filler material 428' may be deposited in the at least one channel 420 and on the first field oxide layer 408 to form a filler layer 428. The filler material 428' may be planarized to provide the filler layer 428 with a substantially flat upper surface 430, as shown in FIG. 4H.

A second active layer 440 may be deposited on top of the filler layer 428, as depicted in FIG. 4I. In an embodiment, the filler material 428' of the filler layer 428 is polysilicon, and the second active layer 440 is an epitaxial polysilicon (epi-polysilicon) or other device-quality silicon layer deposited on the upper surface 430 of the filler layer 428. The second active layer 440 may be doped to have a conductivity suitable to be used as part of an electronic device. For example, the structure shown in FIG. 4I may be considered to be a "double SOI" structure, in which the base layer 402, the first dielectric layer 403, and the first active layer 404 constitute a first SOI structure 450, and in which the first active layer 404, the first field oxide layer 408, and the second active layer 440 (together with the filler layer 428) constitute a second SOI structure 460.

In the double SOI structure, the first active layer 404 may be formed of polysilicon and may serve as a device-quality polysilicon layer for an electronic device corresponding to the first SOI structure. The second active layer 440 may be formed of polysilicon and may serve as a device-quality polysilicon layer for an electronic device corresponding to the second SOI structure of the double SOI structure. The polysilicon of the first active layer 404 of the first SOI structure 450 may also serve as a base layer for the second SOI structure 460.

In an embodiment, the double SOI structure formed of the first SOI structure 450 and the second SOI structure 460 may be used advantageously to form electronic devices on two different levels by selectively using the first and second active layers 404, 440.

The at least one channel 420 is depicted in FIG. 4G to be open in the middle. As mentioned above, another branch of the embodiment is shown in FIGS. 4G'-4I'. In this other branch, the at least one channel 420 may be filled with dielectric material to form at least one channel stop 426', as shown in FIG. 4G'. For example, the dielectric material forming the at least one channel stop 426' may be silicon oxide deposited to fill each channel 420. A thickness of the first field oxide layer 408 may be augmented with the addition of silicon oxide deposited while filling the at least one channel stop 426'. Optionally, the first field oxide layer 408 may be subsequently planarized to have a substantially flat surface.

An intermediary layer 427 may be deposited on the first field oxide layer 408. A second active layer 440 may be deposited on top of the intermediary layer 428', as depicted in FIG. 4H'. In an embodiment, the intermediary layer 427 is formed of polysilicon, and the second active layer 440 is an epitaxial polysilicon (epi-polysilicon) or other device-quality silicon layer deposited on the upper surface 430' of the intermediary layer 427. The second active layer 440 may be doped to have a conductivity suitable to be used as part of an electronic device. For example, the structure shown in FIG. 4I' may be considered to be a "double SOI" structure, in which the base layer 402, the first dielectric layer 403, and the first active layer 404 constitute a first SOI structure 450, and in which the first active layer 404, the first field oxide layer 408, and the second active layer 440 (together with the intermediary layer 427) constitute a second SOI structure 460.

A substrate having the double SOI structure schematically shown in FIG. 4I or FIG. 4I' may be used as a multilayer substrate 500 on which the suspended MEMS device 100 is formed. The following discussion utilizes the double SOI structure of FIG. 4I but is readily adaptable to that of FIG. 4I' by using the at least one channel stop 426' to correspond to the liner layers 426.

Figure 5A:
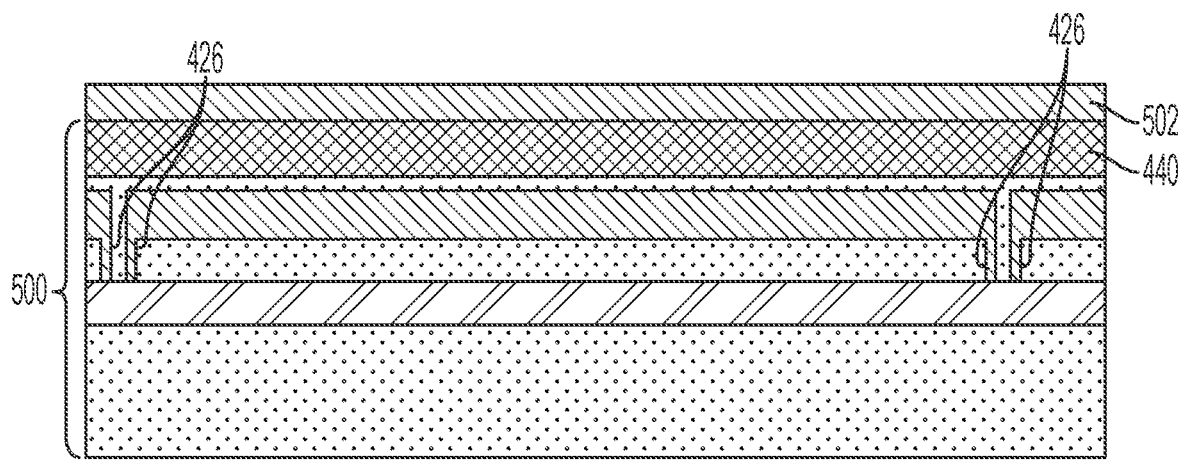
FIGS. 5A-5D schematically show a process flow for fabricating MEMS devices according to embodiments of the present technology.
Figure 5B:
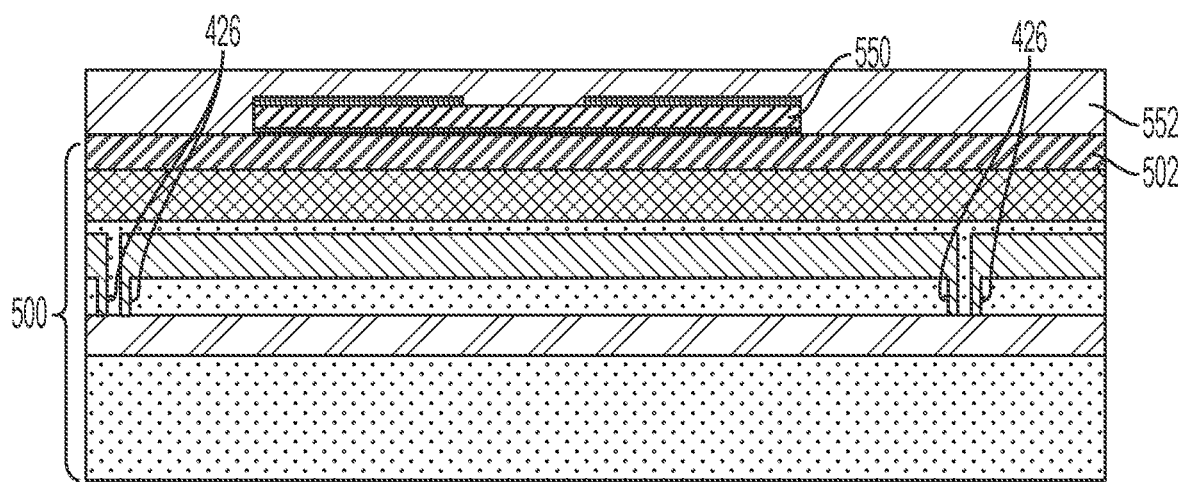

A second field oxide layer 502 may be grown or deposited on the second active layer 440 of the multilayer substrate 500, as shown in FIG. 5A. Subsequently, a stack of layers may be formed and patterned, using known deposition and lithographic techniques, to form a resonator 550 on the second field oxide layer 502 and above an area bounded by the liner layers 426, as shown in FIG. 5B. Optionally, the resonator 550 may be encapsulated with a cap oxide layer 552 that covers top and side surfaces of the resonator 550. The cap oxide layer 552 and the second field oxide layer 502 may be formed of silicon oxide.

Figure 5C:
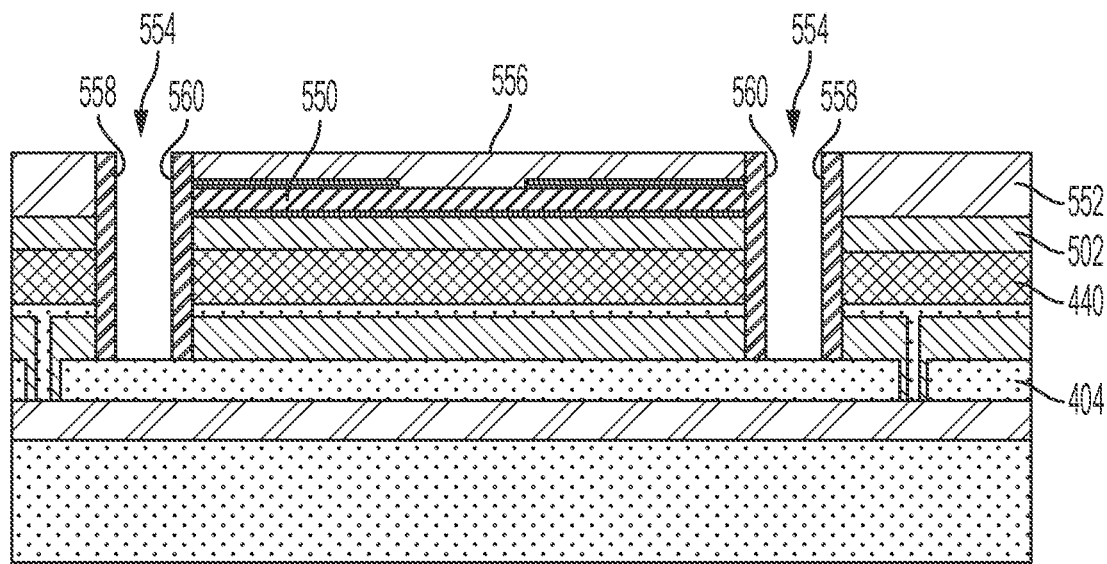

The resonator 550 may be isolated or confined by using standard lithographic processes to form at least one trench 554 extending substantially vertically from an upper surface 556 of the cap oxide layer 552 (or an upper surface of the resonator 550 if no cap oxide layer is present) to an upper surface of the first active layer 404, as shown in FIG. 5C.

Each trench 554 may include a trench sidewall 558 and at least one resonator sidewall 560 located on a side surface of the resonator 550. Each trench sidewall 558 may face a corresponding one of the at least one resonator sidewall 560. Each of the sidewalls 558, 560 may be oriented substantially vertically relative to the upper surface 556 of the cap oxide layer 552 (or the upper surface of the resonator 550 if no cap oxide layer is present). Each trench sidewall 558 and each resonator sidewall 560 is formed of a dielectric material. The dielectric material of the trench sidewall 558 and the dielectric material of the resonator sidewall form vertical spacers that line each trench 554.

Figure 5D:
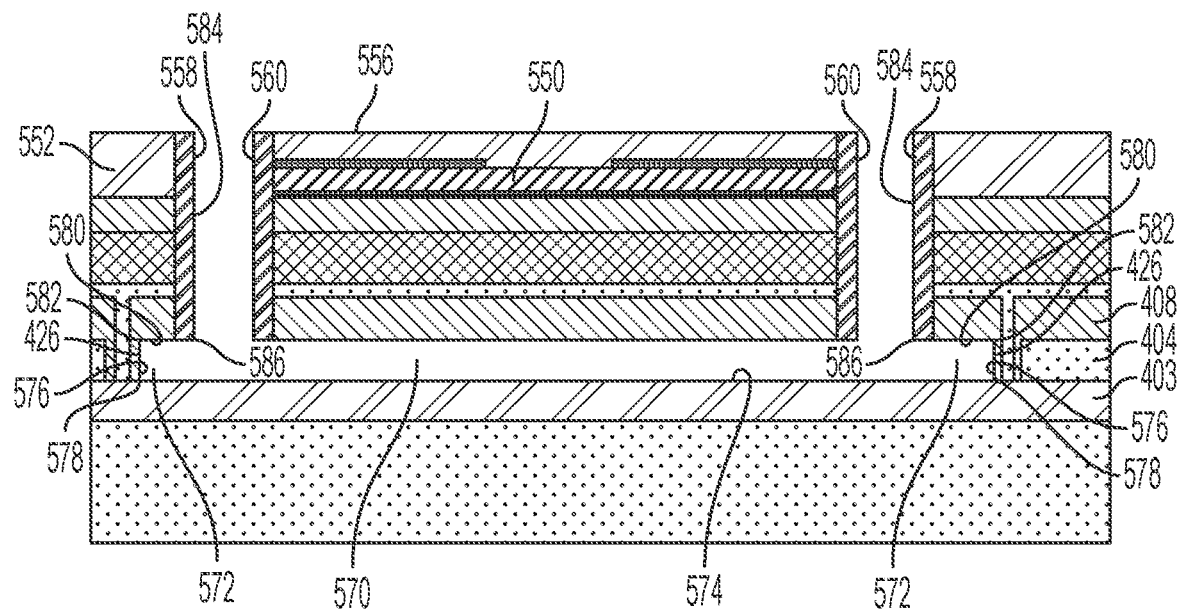

A cavity 570 may be formed by removing a portion of the first active layer 404 that extends from underneath the resonator 550 to the at least one liner layer 426, as shown in FIG. 5D. A portion of the cavity 570 may extend laterally beneath the at least one trench sidewall 558 to form at least one undercut region 572.

In an embodiment, the at least one trench sidewall 558, the at least one resonator sidewall 560, the at least one liner layer 426, the first dielectric layer 403, and the first field oxide layer 408 all may be formed of silicon oxide, and the first active layer 404 may be formed of polysilicon. The polysilicon may be etched selectively without appreciably etching the silicon oxide by using known techniques. For example, $XeF_2$ has a silicon:silicon oxide ($Si:SiO_2$) etch selectivity of over 1000:1, and as a vapor can be transported laterally to reach buried structures (e.g., underneath the resonator 550, under each trench sidewall 558 and into each undercut region 572). Silicon oxide acts as an etch stop and enables the cavity 570 to be formed reproducibly to have known dimensions and a predictable surface topology. That is, as discussed above in connection with FIG. 1, the surfaces 110a, 110b, 110c, 122 of the cavity 104 may be formed of silicon oxide and may have rectilinear corners 108 and linear profiles when viewed in cross section. After the polysilicon is removed, the resulting cavity 570 that surrounds the resonator 550 is bounded by surfaces formed of silicon oxide.

As schematically illustrated in FIG. 5D, the cavity 570 may have a substantially planar bottom surface 574 corresponding to an upper surface of the first dielectric layer 403 (see FIG. 4A); that is, the bottom surface 574 of the cavity 570 may have a cross-sectional profile that is substantially a straight line. The cavity 570 may have at least one lower vertical wall 576 corresponding to the at least one liner layer 426 (see FIG. 4G). That is, each lower vertical wall 576 of the cavity 570 may have a cross-sectional profile that is substantially a straight line. The bottom surface 574 and each lower vertical wall 576 may meet to form a corner 578 that is substantially rectilinear.

The at least one undercut region 572 of the cavity 570 may be bounded by an upper surface 580 that corresponds to a lower surface of the first field oxide layer 408 (see FIG. 4B), the bottom surface 574 of the cavity 570, and at least one liner layer 426 forming the at least one lower vertical wall 576 of the cavity 570. The upper surface 580 and each lower vertical wall 576 may meet to form a corner 582 that is substantially rectilinear.

The cavity 570 also may have at least one upper vertical wall 584 corresponding to the trench sidewall 558 (see FIG. 5C). Each upper vertical wall 584 extends substantially vertically from the upper surface 556 of the cap oxide layer 552 (or the upper surface of the resonator 550 if no cap oxide layer is present) to a surface previously abutting the first active layer 404 (removed to form the cavity 570). Each upper vertical wall 584 has a lower corner 586 that is substantially rectilinear.

In another embodiment of the present technology, a process flow is provided for fabricating a dielectric cavity in a semiconductor material. The cavity may have rectilinear corners, and walls of the cavity may be substantially planar and may be formed of a dielectric material. The cavity may be structured to accommodate a movable device therein. For example, the movable device may be an electromechanical device that is suspended in the cavity, such that the electromechanical device does not contact a bottom surface of the cavity, and such that side and bottom surfaces of the electromechanical device are surrounded by the dielectric material of the cavity. The cavity may be formed by an etching process after the electromechanical device is fabricated, in which the dielectric material forming the walls of the cavity serve as etchstops in the etching process. The cavity may be a silicon oxide cavity, and the electromechanical device may be a MEMS device (e.g., a MEMS resonator) of the type shown in FIG. 2. The process flow is illustrated in FIGS. 6A-6E.

Figure 6A:
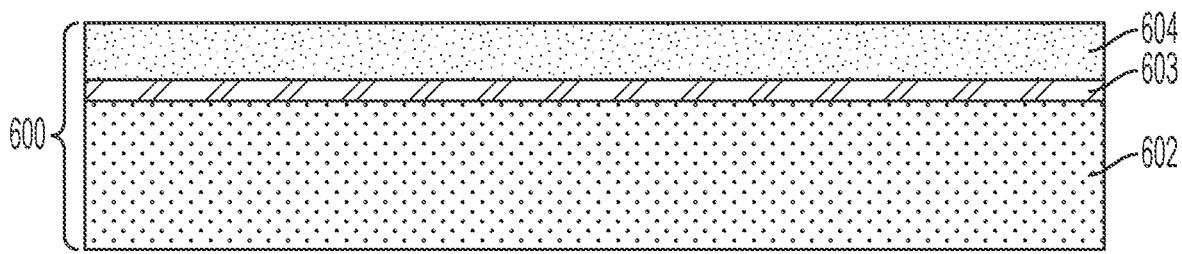
FIGS. 6A-6E schematically show a process flow for fabricating a MEMS device according to an embodiment of the present technology.

FIG. 6A schematically shows an initial substrate 600, which may have a multilayer structure that includes a base or handle layer 602, a sacrificial layer 604, and a first dielectric layer 603 sandwiched between the base layer 602 and the sacrificial layer 604. The base layer 602 may be formed of bulk silicon, the sacrificial layer 604 may be formed of undoped polysilicon, and the first dielectric layer 603 may be formed of silicon oxide.

Figure 6B:
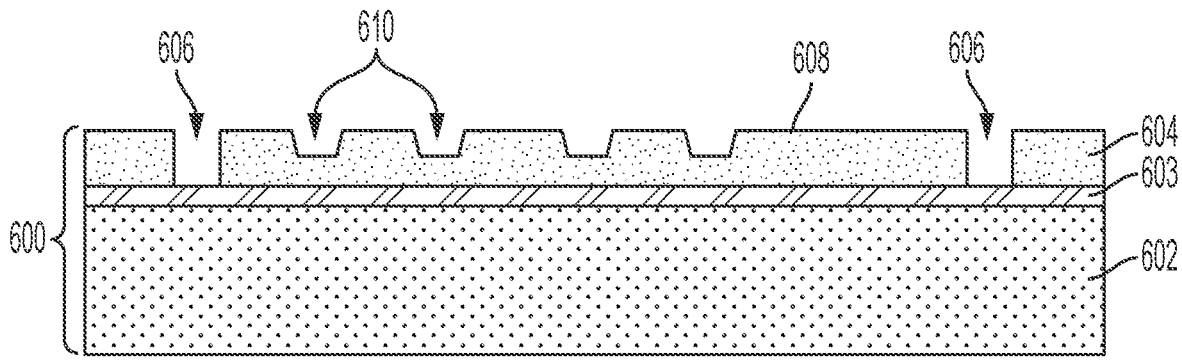

The sacrificial layer 604 may be patterned using known lithographic techniques to produce at least one through-channel 606 that extends from an upper surface 608 of the sacrificial layer 604 entirely through a thickness of the sacrificial layer 604 to the first dielectric layer 603, as shown schematically in FIG. 6B. The sacrificial layer 604 also may be patterned using known lithographic techniques to produce recessed portions 610 extending from the upper surface 608 partially through the thickness of the sacrificial layer 604.

Figure 6C:
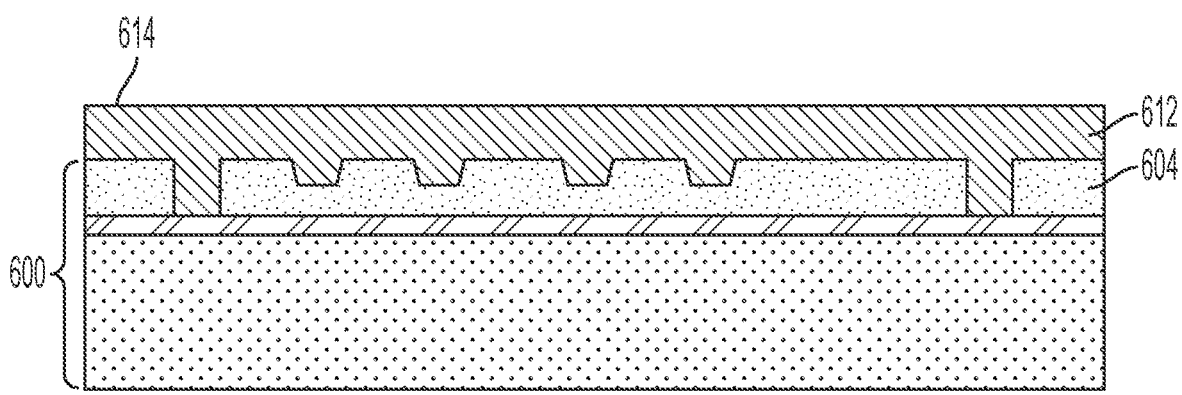

The upper surface 608 of the sacrificial layer, the at least one through-channel 606, and the recessed portions 610 are covered with a dielectric material forming a projection layer 612. The dielectric material fills the at least one through-channel 606 and the recessed portions 610, as shown in FIG. 6C. For example, the sacrificial layer 604 may be formed of undoped polysilicon, and the projection layer 612 may be formed of silicon oxide grown by oxidation of the undoped polysilicon. Optionally, an upper surface 614 of the projection layer 612 may be planarized to form a flat surface for subsequent processing.

Figure 6D:
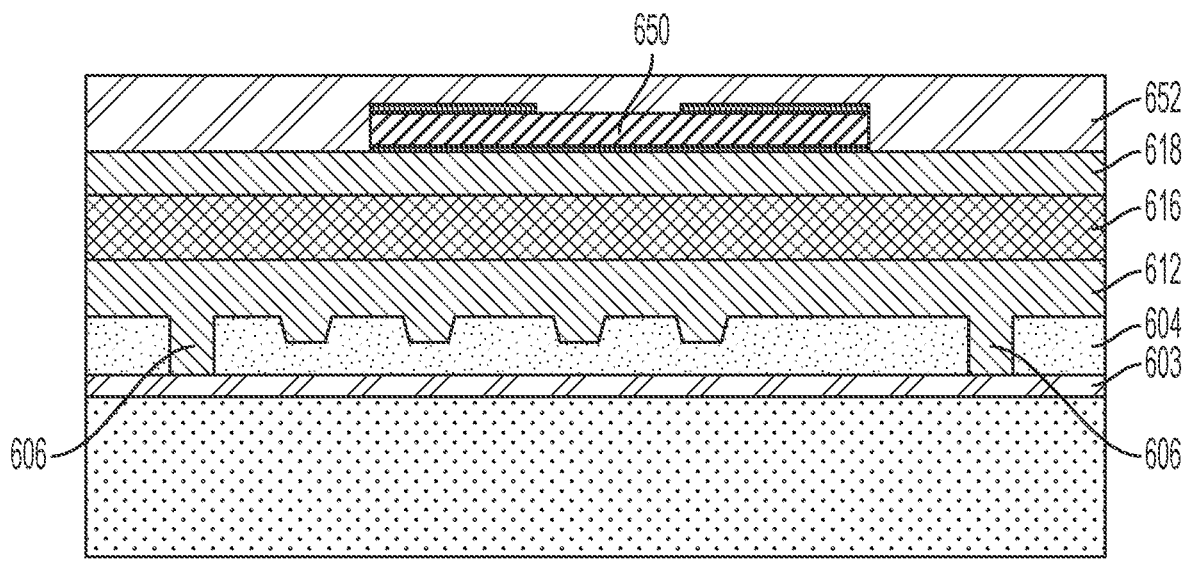

As depicted in FIG. 6D, a first active layer 616 is formed on the upper surface 614 of the projection layer 612, and a first field oxide layer 618 is formed on the first active layer 616. For example, the first active layer 616 may be formed of device-quality polysilicon, and the first field oxide layer 618 may be silicon oxide deposited or thermally grown on the first active layer 616.

Subsequently, similar to the discussion above regarding FIGS. 5A-5D, a stack of layers may be formed and patterned, using known deposition and lithographic techniques, to form a resonator 650 on the first field oxide layer 618 and above an area bounded by the at least one dielectric-filled through channel 606. Optionally, the resonator 650 may be encapsulated with a cap oxide layer 652 that covers top and side surfaces of the resonator 650. The cap oxide layer 652 and the first field oxide layer 618 may be formed of silicon oxide.

Figure 6E:
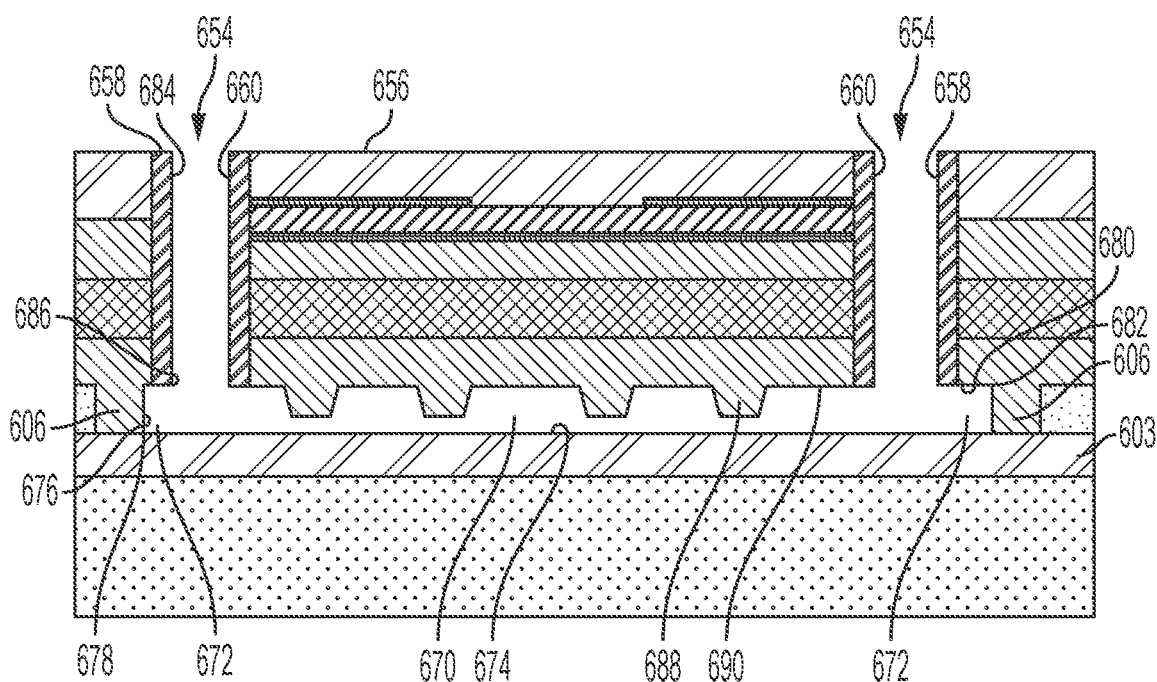

The resonator 650 may be isolated or confined by using standard lithographic processes to form at least one trench 654 extending substantially vertically from an upper surface 656 of the cap oxide layer 652 (or an upper surface of the resonator 650 if no cap oxide layer is present) to an upper surface of the sacrificial layer 604, as shown in FIG. 6E.

Each trench 654 may include a trench sidewall 658 and at least one resonator sidewall 660 located on a side surface of the resonator 650. Each trench sidewall 658 may face a corresponding one of the at least one resonator sidewall 660. Each of the sidewalls 658, 660 may be oriented substantially vertically relative to the upper surface 656 of the cap oxide layer 652 (or the upper surface of the resonator 650 if no cap oxide layer is present). Each trench sidewall 658 and each resonator sidewall 660 is formed of a dielectric material. The dielectric material of the trench sidewall 658 and the dielectric material of the resonator sidewall form vertical spacers that line each trench 654.

A cavity 670 may be formed by removing a portion of the sacrificial layer 604 that extends from underneath the resonator 650 to the at least one dielectric-filled through channel 606. A portion of the cavity 670 may extend laterally beneath the at least one trench sidewall 658 to form at least one undercut region 672.

The at least one trench sidewall 658, the at least one resonator sidewall 660, the at least one dielectric-filled through channel 606, the first dielectric layer 603, and the projection layer 612 all may be formed of silicon oxide, and the sacrificial layer 604 may be formed of polysilicon. As discussed above, the polysilicon may be etched selectively without appreciably etching the silicon oxide by using, for example, $XeF_2$. After the polysilicon is removed, the resulting cavity 670 that surrounds the resonator 650 is bounded by surfaces formed of silicon oxide.

As schematically illustrated in FIG. 6E, the cavity 670 may have a substantially planar bottom surface 674 corresponding to an upper surface of the first dielectric layer 603. The cavity 670 may have at least one lower vertical wall 676 corresponding to the at least one dielectric-filled through channel 606. The bottom surface 674 and each lower vertical wall 676 may meet to form a corner 678 that is substantially rectilinear.

The at least one undercut region 672 of the cavity 670 may be bounded by an upper surface 680, the bottom surface 674 of the cavity 670, and the at least one dielectric-filled through channel 606 forming the at least one lower vertical wall 676 of the cavity 650. The upper surface 680 and each lower vertical wall 676 may meet to form a corner 682 that is substantially rectilinear.

The cavity 670 also may have at least one upper vertical wall 684 corresponding to the trench sidewall 658. Each upper vertical wall 684 extends substantially vertically from the upper surface 656 of the cap oxide layer 652 (or the upper surface of the resonator 650 if no cap oxide layer is present) to a surface previously abutting the sacrificial layer 604 (removed to form the cavity 650). Each upper vertical wall 684 has a lower corner 686 that is substantially rectilinear.

The resonator 650 may have projections 688 that extend from a bottom surface 690 of the resonator 650. The projections 688 correspond to the dielectric-filled recessed portions 610, and may be formed of a material (e.g., silicon oxide) that may provide mechanical and thermal compensation for the resonator 650 to counteract temperature fluctuations and vibrational fluctuations in an environment of the resonator 650 and thus may enable the resonator 650 to operate stably in the presence of such fluctuations.

Figure 7A:
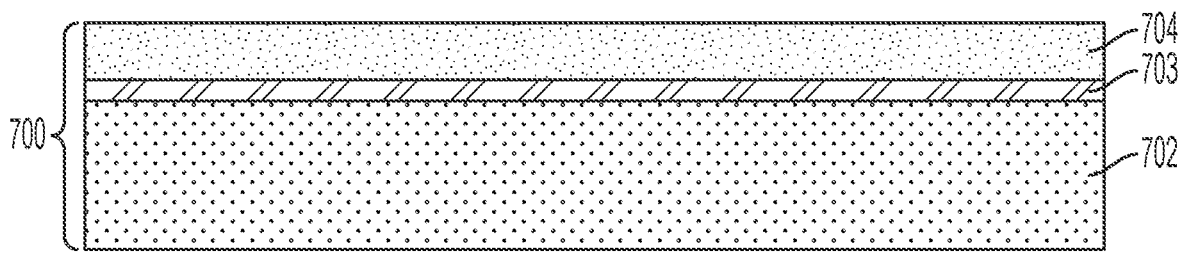
FIGS. 7A-7C schematically show a process flow for fabricating a MEMS device according to an embodiment of the present technology.
Figure 7B:
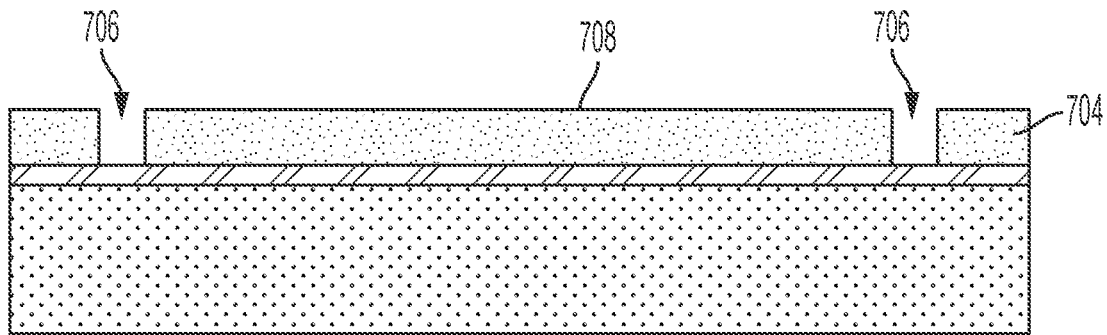
Figure 7C:
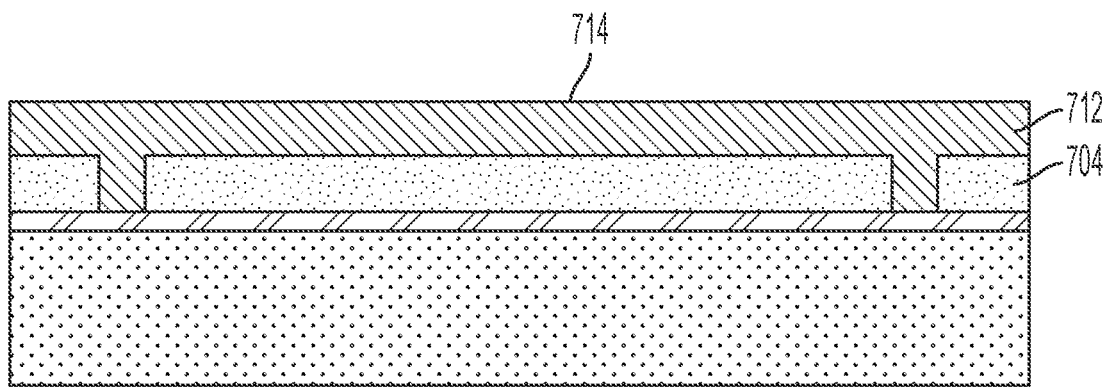

In yet another embodiment of the present technology, a process flow for fabricating a MEMS device of the type shown in FIG. 2 is illustrated in FIGS. 7A-7C. In this embodiment, a simpler substrate is used, and the multilayer substrate having the double SOI structure (see FIG. 4I) is not used.

FIG. 7A schematically shows an initial substrate 700, which may have a multilayer structure that includes a base or handle layer 702, a sacrificial layer 704, and a first dielectric layer 703 sandwiched between the base layer 702 and the sacrificial layer 704. The base layer 702 may be formed of bulk silicon, the sacrificial layer 704 may be formed of undoped polysilicon, and the first dielectric layer 703 may be formed of silicon oxide.

The sacrificial layer 704 may be patterned using known lithographic techniques to produce at least one through-channel 706 that extends from an upper surface 708 of the sacrificial layer 704 entirely through a thickness of the sacrificial layer 704 to the first dielectric layer 703, as shown schematically in FIG. 7B. The upper surface 708 of the sacrificial layer and the at least one through-channel 706 are covered with a dielectric material forming a second dielectric layer 712. The dielectric material fills the at least one through-channel 706, as shown in FIG. 7C. For example, the sacrificial layer 704 may be formed of undoped polysilicon, and the second dielectric layer 712 may be formed of silicon oxide grown by oxidation of the undoped polysilicon. Optionally, an upper surface 714 of the second dielectric layer 712 may be planarized to form a flat surface for subsequent processing.

Subsequently, the processing is similar to that discussed above with reference to FIGS. 6D and 6D. In the subsequent processing:

- a first active layer may be formed on the upper surface 714 of the second dielectric layer 712;
- a first field oxide layer may be formed on the first active layer 716;
- a resonator with an optional cap oxide layer may be formed on the first field oxide layer and above an area bounded by the at least one dielectric-filled through channel 706;
- the resonator may be confined by at least one trench extending substantially vertically from an upper surface of the cap oxide layer (or an upper surface of the resonator if no cap oxide layer is present) to an upper surface of the sacrificial layer 704;
- a cavity may be formed by removing a portion of the sacrificial layer 704 that extends from underneath the resonator to the at least one dielectric-filled through channel 706. A portion of the cavity may extend laterally beneath the at least one trench sidewall to form at least one undercut region.

The resulting structure is similar to that shown in FIG. 6E but without the projections 688.

Figure 8:
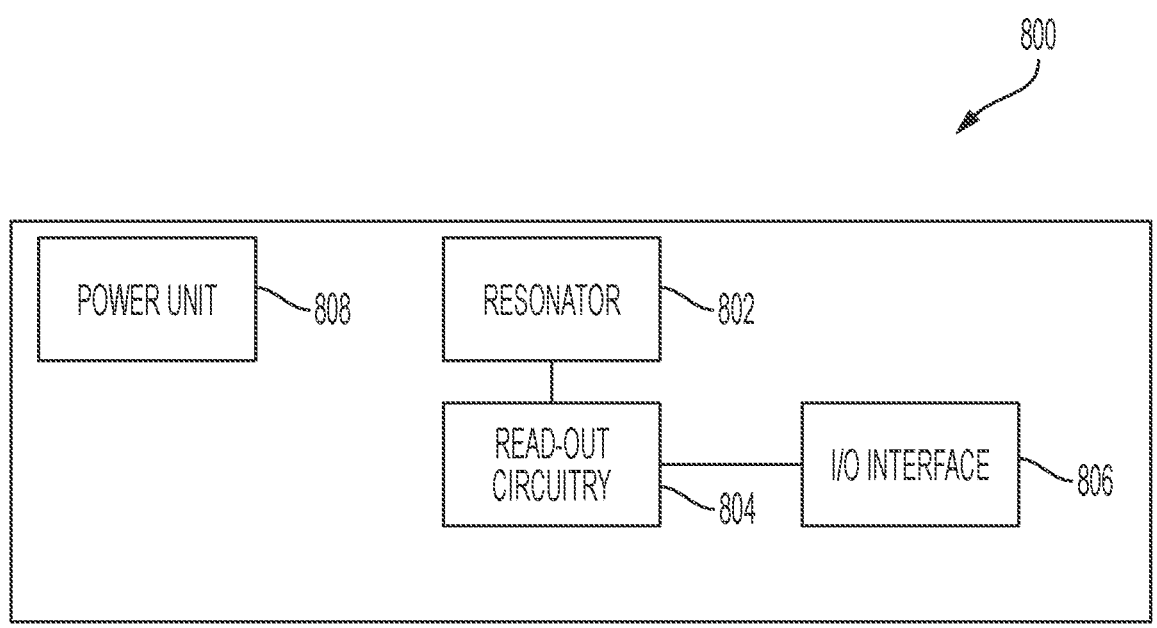
FIG. 8 illustrates a device incorporating a MEMS device of the types described herein.

MEMS devices of the types described herein may be used in various applications and systems. FIG. 8 illustrates a non-limiting example of a system 800 incorporating a MEMS resonator as described herein. The system 800 may include a resonator 802, read-out circuitry 804, an input/output (I/O) interface 806, and a power unit 808.

The read-out circuitry 804 may be configured to provide signals proportional to quantities sensed by the resonator 802. For example, the read-out circuitry 804 may be connected to contacts (not shown) on the resonator 802 to generate signals based on sensed capacitances. The read-out circuitry 804 may include any suitable component(s) for performing such read-out functions, as well as circuitry for signal processing functions such as filtering, amplifying, and demodulating. The read-out circuitry 804 may be an application specific integrated circuit (ASIC) in some embodiments, and may be formed on a different substrate from the resonator 802, or the read-out circuitry 804 and the resonator 802 may be formed on the same substrate in some embodiments.

In the system 800 of FIG. 8, the read-out circuitry 804 is connected to the I/O interface 806, which may serve as a communication interface through which the system 800 communicates with an external device, such as a remote computer or a server. Thus, the I/O interface 806 may transmit the signals based on the capacitances sensed by the resonator 802 to outside the system 800 for further processing and/or display. Additionally or alternatively, the I/O interface 806 may receive communications from an external device, such as control signals, wireless charging signals, and/or software updates.

The I/O interface 806 may be wired or wireless. Suitable wired connections include Universal Serial Bus (USB) and Firewire connections, among others. In those embodiments in which a wired connection is used, the connection may be pluggable. Wired connections may be used in settings in which the system 800 is relatively immobile, for example when fixed on a substantially stationary object, or when the distance between system 800 and an external device with which it communicates remains relatively constant. In some embodiments, however, the I/O interface may be wireless, for example communicating via a flexible radio frequency (RF) antenna.

The power unit 808 may provide power to some or all the components of the system 800, and may take various forms. In some embodiments, the power unit 808 may include one or more batteries. In some embodiments, the power unit 808 may include circuitry to convert AC power to DC power. For example, the power unit 808 may receive AC power from a power source external to system 800, such as via the I/O interface 806, and may provide DC power to some or all other components of system 800. In such instances, the power unit 808 may include a rectifier, a voltage regulator, a DC-DC converter, or any other suitable apparatus for power conversion.

As described, MEMS devices of the types described herein may be used in various applications. For example, industrial applications, medical applications, and athletic applications may make use of the structures described herein.

Some aspects of the present technology may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The terms "approximately" and "about" if used herein may be construed to mean within ±20% of a target value in some embodiments, within ±10% of a target value in some embodiments, within ±5% of a target value in some embodiments, and within ±2% of a target value in some embodiments. The terms "approximately" and "about" may equal the target value.

The term "substantially" if used herein may be construed to mean within 95% of a target value in some embodiments, within 98% of a target value in some embodiments, within 99% of a target value in some embodiments, and within 99.5% of a target value in some embodiments. In some embodiments, the term "substantially" may equal 100% of the target value.

What is claimed is:

1. A microelectromechanical system (MEMS) device comprising:
    a substrate having a cavity formed therein, the cavity including a bottom surface, at least one sidewall surface extending substantially perpendicularly from the bottom surface, and an open top;
    a dielectric material covering each of the bottom surface and the at least one sidewall surface of the cavity; and
    a movable electromechanical device suspended in the cavity above the bottom surface through the open top, the electromechanical device including a bottom portion and side portions facing the dielectric material of the bottom surface and the dielectric material of each of the at least one sidewall surface, respectively,
    wherein the bottom surface of the cavity is substantially planar, each of the at least one sidewall surface of the cavity has a substantially linear cross-sectional profile, and the bottom surface of the cavity and the each sidewall surface of the cavity meet at a rectilinear corner, and
    wherein the bottom portion and the side portions of the electromechanical device are formed of a dielectric material.

2. The MEMS device according to claim 1, wherein the dielectric material covering the bottom surface and the at least one sidewall surface of the cavity is silicon oxide.

3. The MEMS device according to claim 1, wherein the electromechanical device is a resonator.

4. The MEMS device according to claim 3, wherein the resonator includes a polysilicon layer formed of a plurality of polysilicon sublayers having different doping levels.

5. The MEMS device according to claim 1, wherein the dielectric material covering the bottom portion and the side portions of the resonator is silicon oxide.

6. The MEMS device according to claim 1, wherein the electromechanical device is completely surrounded on side and bottom surfaces thereof by the dielectric material covering each of the bottom surface and the at least one sidewall surface of the cavity.

7. The MEMS device according to claim 1, wherein the bottom portion of the electromechanical device includes a plurality of projections extending toward the bottom surface of the cavity such that the bottom portion of the electromechanical device has a non-linear cross-sectional profile.

8. A microelectromechanical system (MEMS) device comprising:
    a substrate having a cavity formed therein, the cavity including a bottom surface, at least one sidewall surface extending substantially perpendicularly from the bottom surface, and an open top;
    a dielectric material covering each of the bottom surface and the at least one sidewall surface of the cavity; and
    a movable electromechanical device suspended in the cavity above the bottom surface through the open top, the electromechanical device including a bottom portion and side portions facing the dielectric material of the bottom surface and the dielectric material of each of the at least one sidewall surface, respectively,
    wherein the bottom surface of the cavity is substantially planar, each of the at least one sidewall surface of the cavity has a substantially linear cross-sectional profile, and the bottom surface of the cavity and the each sidewall surface of the cavity meet at a rectilinear corner, and wherein the bottom portion of the electromechanical device includes a plurality of projections extending toward the bottom surface of the cavity such that the bottom portion of the electromechanical device has a non-linear cross-sectional profile.

9. A microelectromechanical system (MEMS) device comprising:

a substrate having a cavity formed therein, the cavity including a bottom surface, at least one sidewall surface extending substantially perpendicularly from the bottom surface, and an open top;

a dielectric material covering each of the bottom surface and the at least one sidewall surface of the cavity; and a movable electromechanical device suspended in the cavity above the bottom surface through the open top, the electromechanical device including a bottom portion and side portions facing the dielectric material of the bottom surface and the dielectric material of each of the at least one sidewall surface, respectively, wherein the bottom surface of the cavity is substantially planar, each of the at least one sidewall surface of the cavity has a substantially linear cross-sectional profile, and the bottom surface of the cavity and the each sidewall surface of the cavity meet at a rectilinear corner, and wherein:
 the substrate includes:
  a first SOI structure having a first active layer, and
  a second SOI structure having a second active layer,
 the electromechanical device is formed using the second active layer, and
 the cavity is formed from a portion of the first active layer.

10. The MEMS device according to claim 9, wherein the second active layer includes a plurality of sublayers of different doping levels.

11. The MEMS device according to claim 9, wherein the second active layer is formed of a plurality of polysilicon layers of different doping levels.

12. The MEMS device according to claim 9, wherein the bottom portion of the electromechanical device includes a plurality of projections extending toward the bottom surface of the cavity such that the bottom portion of the electromechanical device has a non-linear cross-sectional profile.

13. The MEMS device according to claim 9, wherein a trench surrounds at least a portion of the electromechanical device, the trench including at least one dielectric trench wall facing a dielectric side surface of the electromechanical device.

14. A microelectromechanical system (MEMS) device comprising:

a substrate having a dielectric cavity formed therein, the cavity including a bottom surface, at least one sidewall surface extending substantially perpendicularly from the bottom surface, and an open top; and a movable electromechanical device suspended in the cavity above the bottom surface through the open top, the electromechanical device including a bottom portion and side portions facing the dielectric material of the bottom surface and the dielectric material of each of the at least one sidewall surface, respectively, wherein the bottom surface of the cavity is substantially planar, each of the at least one sidewall surface of the cavity has a substantially linear cross-sectional profile, and the bottom surface of the cavity and the each sidewall surface of the cavity meet at a rectilinear corner, and wherein:
 the substrate includes:
  a first SOI structure having a first active layer, and
  a second SOI structure having a second active layer,
 the electromechanical device is formed using the second active layer, and
 the cavity is formed from a portion of the first active layer.

15. The MEMS device according to claim 14, wherein the second active layer includes a plurality of sublayers of different doping levels.

16. The MEMS device according to claim 14, wherein the second active layer is formed of a plurality of polysilicon layers of different doping levels.

17. The MEMS device according to claim 14, wherein the dielectric cavity is comprised of a layer of silicon oxide covering the bottom surface and the at least one sidewall surface.

18. The MEMS device according to claim 14, wherein the electromechanical device is a resonator.

19. The MEMS device according to claim 14, wherein the bottom portion of the electromechanical device includes a plurality of projections extending toward the bottom surface of the cavity such that the bottom portion of the electromechanical device has a non-linear cross-sectional profile.

20. The MEMS device according to claim 14, wherein a trench surrounds at least a portion of the electromechanical device, the trench including at least one dielectric trench wall facing a dielectric side surface of the electromechanical device.

* * * * *